INTERNAL CONNECTION METHOD FOR CIRCUIT BOARDS

Filed Aug. 1, 1966

INVENTOR.
WILLIAM P. DUGAN,
By L E Carnahan
AGENT.

United States Patent Office 3,426,427
Patented Feb. 11, 1969

3,426,427

INTERNAL CONNECTION METHOD FOR CIRCUIT BOARDS

William P. Dugan, Ontario, Calif., assignor to General Dynamics Corporation, Pomona, Calif., a corporation of Delaware Filed Aug. 1, 1966, Ser. No. 569,258
U.S. Cl. 29—625 7 Claims
Int. Cl. B41m 3/08; H05k 3/10; C23b 5/02

ABSTRACT OF THE DISCLOSURE

In a single or multi-layer circuit board, a process for the electrical connection from the layer of copper plating to the copper circuits is set forth in which the copper is activated after the plastic insulation board has been sensitized.

Circuit boards and various methods for fabricating same are known in the art. Also, circuit boards having electrical connections integral therewith, such as plated through holes, eyelets, tubular members, etc., are known. In most of the prior known processes for making circuit boards having connector devices therein, the insulation board is copper clad and the desired circuits are formed from the copper, with the connector member attached by electroplating techniques, for example. These prior art processes have, in most instances, produced satisfactory electrical and mechanical adhesion between the circuits and the connector member. However, in many instances, tests have shown that better adhesion in this area was desirable.

Therefore, it is an object of this invention to provide a unique method of fabricating circuit boards.

A further object of the invention is to provide a method of producing a consistent metal-to-metal bond between copper circuits and copper electrical connector members of single-layer and multi-layer circuit boards.

Another object of the invention is to provide a method of producing consistent adhesion between a layer of copper and a layer of copper plating applied thereto.

Another object of the invention is to provide a method of producing single-layer and multi-layer circuit boards having electrical connectors integral therewith.

Another object of the invention is to provide a method of activating copper after the plastic which supports the copper has been sensitized.

Another object of the invention is to ensure reliability of making electrical connections to buried circuits inside multi-layer circuit boards.

Figure 1:
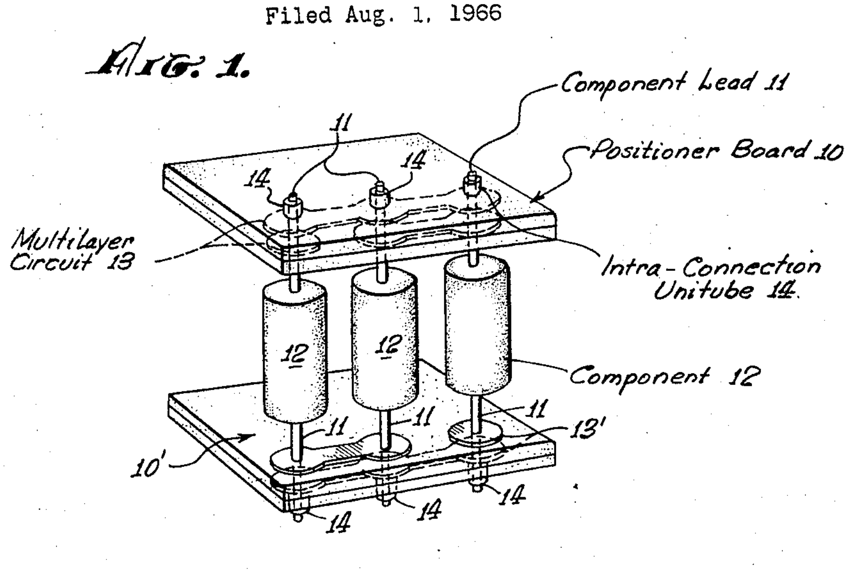
Figure 2:
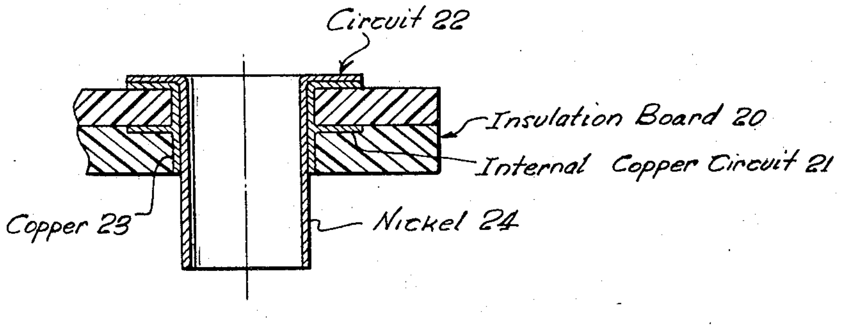

Other objects of the invention will become readily apparent from the following written description and accompanying drawings wherein:

FIG. 1 is a view illhstrating an application of multi-layer circuit boards made in accordance with the invention; and FIG. 2 is an enlarged cross-sectional view of an embodiment of a circuit board made in accordance with this invention.

Referring now to the drawings, FIG. 1 illustrates an application of circuit boards utilizing the invention wherein multi-layer carrier boards 10 and 10' are intraconnected with leads 11 of a plurality of components 12. Integral with each board 10 and 10' are multi-layer circuits indicated generally at 13 and 13', respectively, which are interconnected to certain of component leads 11 via intraconnection tubular members (unitubes) 14, leads 11 extending through members 14. Circuits 13 in the upper board 10 are defined by one layer on the bottom of the board and one layer in the center of the board as shown in dotted lines, while the circuits 13' in the lower board 10' comprise an internal layer shown in dotted lines and an external layer on top of the board.

As known in the art, the component leads 11 and tubular members 14 may be interconnected by welding or soldering.

While the present invention is applicable to any type of circuit boards, FIG. 2 illustrates an embodiment which may be utilized as shown in FIG. 1 and which may incorporate the invention to provide consistent metal to metal bond between the copper on the carrier board and the electroplating thereon. The insulation or carrier board 20 is provided with integral internal and external copper circuits 21 and 22 which may, if desired, be interconnected by a copper layer 23 via copper plating techniques, copper layer 23 being overplated in desired areas by a nickel tubular member (unitube) 24.

Although additional steps not constituting part of this invention are required to produce the FIG. 2 embodiment, these additional steps are deemed unnecessary to be set forth herein in detail. However, the operational sequence of fabricating multi-layer circuit boards essentially the same as the FIG. 2 embodiment, except for the inventive process set forth herein, is described and claimed in copending U.S. Patent application Ser. No. 413,689, filed Nov. 25, 1964, now Patent No. 3,396,459, and assigned to the same assignee. It is again pointed out that the present invention is not limited to any particular type of circuit board and may be utilized in various applications where there is a need to activate copper after the supporting plastic material has been sensitized to provide a consistent metal to metal bond during operations.

The following is a sequence of operations for illustrating the inventive concept:

(1) Drill holes where required through a laminated circuit board having internal and external copper circuits.

(2) Deburr the top and bottom surfaces of the laminated board.

(3) Liquid hone in conventional manner.

(4) Apply a suitable cleaner solution, for example, such as Oakite #90 manufactured by the Oakite Corporation and mixed at the ratio of 8 oz./gal. water.

(5) Rinse with water.

(6) Apply a 10% sulfuric acid solution.

(7) Water rinse.

(8) Apply an ammonium persulfate solution mixed in a ratio of 32 oz./gal. water.

(9) Water rinse.

(10) Apply a 10% sulfuric acid solution.

(11) Apply a suitable catalyst solution, such as that known as 6F produced by Shipley Corporation.

(12) Rinse with water.

(13) Apply a suitable accelerator, such as that known as No. 19 produced by Shipley Corporation.

(14) Water rinse.

(15) Again apply an ammonium persulfate solution mixed as in Step 8 above.

(16) Rinse with water.

(17) Again apply a 10% sulfuric acid solution.

(18) Water rinse.

(19) Electroless copper plate the holes to a desired thickness.

(20) Rinse with water.

(21) Electrocopper plate the holes and desired copper surfaces in conventional manner to the required thickness.

If, for example, the above procedure was utilized in the making of the FIG. 2 circuit board, the process would be continued by electroplating the exposed copper surfaces with nickel and removing the backing material required during the fabrication process as set forth in the above referenced application.

Tests have shown that the above outlined procedure produces a consistent metal to metal bond between the internal copper circuit 21 and the copper layer 23 of FIG. 2, for example. Thus this invention provides a method of insuring the reliability of making electrical connection between copper surfaces, particularly connections to buried circuits such as those inside multi-layer circuit boards.

Although specific materials and a specific sequence of operation have been set forth, modifications will become apparent to those skilled in the art, and it is intended to cover in the appended claims, all such modifications as come within the true spirit and scope of the invention.

What I claim is:

1. A method for producing reliable electrical connection by consistent metal to metal bond between a layer of copper supported by insulation material and copper electroplated thereon comprising the steps of: applying to a sheet of copper supported by insulation material a suitable cleaner solution, rinsing, applying a sulfuric acid solution, rinsing, applying an ammonium persulfate solution, rinsing, applying a second sulfuric acid solution, applying a catalyst solution, rinsing, applying an accelerator, rinsing, again applying an ammonium persulfate solution, rinsing, applying another sulfuric acid solution, rinsing, electroless copper plating the desired areas to a desired thickness, rinsing, and electrocopper plating the copper surfaces to a desired thickness.

2. The method defined in claim 1, wherein the rinsing steps are accomplished by water rinsing.

3. The method defined in claim 1, additionally including the steps of drilling at least one aperture through the copper clad material, deburring the surfaces thereof, and liquid honing the assembly prior to the step of applying the cleaner solution.

4. The method defined in claim 1, wherein the sulfuric acid solution applied in each of the above mentioned steps is composed of 10% sulfuric acid.

5. The method defined in claim 1, wherein the ammonium persulfate solution applied is mixed in the ratio of about 32 ounces per gallon of suitable diluting agent.

6. The method defined in claim 1, additionally including the step of electroplating nickel on the copper surfaces.

7. The method defined in claim 1, wherein the insulation material is a plastic.

References Cited

UNITED STATES PATENTS

| | | | |
|---|---|---|---|
| 2,947,064 | 8/1960 | Langton | 29—625 |
| 3,011,920 | 12/1961 | Shipley | 117—50 X |
| 3,266,929 | 8/1966 | Lareau | 117—130 |
| 3,268,653 | 8/1966 | McNutt | 29—625 X |
| 3,276,927 | 10/1966 | Medford | 29—625 X |
| 3,269,861 | 8/1966 | Schneble et al. | 117—213 |

JOHN F. CAMPBELL, *Primary Examiner.*

D. C. REILEY, *Assistant Examiner.*

U.S. Cl. X.R.

204—30, 32; 117—50, 213; 29—628